United States Patent [19]

Lin

[11] Patent Number: 5,036,381

[45] Date of Patent: Jul. 30, 1991

[54] MULTIPLE ELECTRONIC DEVICES WITHIN A SINGLE CARRIER STRUCTURE

[75] Inventor: Paul T. Lin, Austin, Tex.

[73] Assignee: Motorola, Inc., Schaumburg, Ill.

[21] Appl. No.: 538,629

[22] Filed: Jun. 15, 1990

[51] Int. Cl.⁵ .................. H01L 23/48; H01L 29/44; H01L 29/52; H01L 29/60

[52] U.S. Cl. ........................ 357/70; 357/72; 357/74

[58] Field of Search .................... 357/70, 72, 74

[56] References Cited

U.S. PATENT DOCUMENTS

| | | | |
|---|---|---|---|
| 4,701,781 | 10/1987 | Sankhagowit | 357/70 |
| 4,791,472 | 12/1988 | Okikawa et al. | 357/70 |
| 4,801,997 | 1/1989 | Ono et al. | 357/70 |
| 4,837,184 | 6/1989 | Lin et al. | 357/74 |
| 4,897,602 | 1/1990 | Lin et al. | 324/158 |
| 4,951,119 | 8/1990 | Yonemochi et al. | 357/70 |

Primary Examiner—Andrew J. James
Assistant Examiner—T. Davenport
Attorney, Agent, or Firm—Maurice J. Jones

[57] ABSTRACT

The disclosed invention comprises multiple semiconductor devices within a single carrier structure. In accordance with one embodiment of the invention, a plurality of semiconductor die are coupled to the leads of a leadframe and are encapsulated by individual package bodies. A carrier structure is formed which encircles all of the die and encapsulates portions of the distal ends of the leads. The extreme distal portions of the leads extend through the carrier to form contact points which are used to access the semiconductor die. By having multiple devices within a single carrier, productivity is improved and costs associated with leadframe and carrier structure materials are reduced.

13 Claims, 4 Drawing Sheets

MULTIPLE ELECTRONIC DEVICES WITHIN A SINGLE CARRIER STRUCTURE

RELATED PATENTS

This application is related to commonly assigned Lin et al, U.S. Pat. Nos. 4,837,184 and 4,897,602.

BACKGROUND OF THE INVENTION

This invention relates to packaged electronic devices in general and more particularly to electronic devices having peripheral carrier structures.

The packaging technology for electronic components has many challenges facing it. Electronic components, such as integrated circuits (ICs), are becoming very dense with ultra large and very large scale integration (ULSI and VLSI). One challenge brought to packaging technology by such complex integration is manufacturing reliable packages with a high lead count. Leads are external to the package and are used to make electrical contacts to the semiconductor die located within the package. Higher levels of integration require more electrical connections, thus more leads. However, at the same time both the manufacturers and users of semiconductor devices want the size of the die and package to be small in order to minimize the device footprint. The footprint is the space required to mount the device onto a substrate, typically a printed circuit (PC) board.

One way of conserving PC board space is to stack components on top of one another. While this reduces the footprint, the technique has not become an industry standard and must overcome problems such as heat dissipation and new, unproven assembly procedures. Another way is to simply shrink existing components and packages. This is a widely practiced method and from a packaging aspect can be accomplished by reducing the pitch of the leads, or the lead-to-lead distance. Leadframe manufacturers have been successful, to a degree, in producing fine-pitch leadframes. A technology known as TAB (tape automated bonding) has also been helpful in allowing semiconductor manufacturers to produce fine-pitch packages. But with these packages comes another problem, namely handling. In making fine-pitch leadframes, manufacturers reduce the thickness and width of each lead, making them more fragile. On a packaged semiconductor device, the fragile leads are very susceptible to damage, especially during subsequent handling operations, testing, and shipping.

Various ways of preventing or minimizing lead damage have been established. For example, automation has been implemented to reduce handling operations, sockets are designed to minimize damage during testing, and prior to shipment the devices are placed in specially designed rails or trays. Another way of protecting fragile leads which is gaining popularity and is becoming an industry standard is the use of a protective carrier structure. The carrier structure is formed around the device, spaced apart from the package body, and has exposed contact points which allow for testing before the leads become free-standing and are formed into their final shape. Hence, leads are protected from damage during many handling operations and testing. Devices can be excised from the carrier just prior to shipment or can be shipped within the carrier, reducing the susceptibility to lead damage even further.

A draw-back to using a carrier structure is that it raises the material costs of manufacturing semiconductor devices. Typically, the carrier structure is used with plastic packages and is molded with the same molding compound used in the package body itself. With the carrier being almost four times the volume of the package body, material costs increase dramatically. In other applications, the carrier is made of another material, such as a metal or metal alloy, which also greatly increase material costs. The size of the leadframes is also increased and fewer devices can be made from one leadframe which further increases costs.

In addition to reducing lead damage, semiconductor manufacturers are also interested in reducing the number of handling operations to increase productivity. Once packages are excised from the leadframe, they are handled as individual units. For instance, a leadframe which is designed to make ten devices is handled as one unit until the devices are singulated, at which point the devices are considered ten units and require ten times the number of handling operations. Automated handling equipment is of considerable importance in increasing the manufacturer's productivity. But another way to increase productivity is to reduce the number of handling sequences required for the same number of devices. In other words, being able to keep the ten devices mentioned earlier as one unit would require one handling sequence at each operation, as opposed to ten. Thereby, productivity is increased.

Therefore, a need existed for an improved semiconductor device, more specifically for an improved device with a carrier structure, which would protect the leads of the package during various handling operations, testing, and shipment, which would reduce material costs over existing methods, and which would improve productivity.

BRIEF SUMMARY OF THE INVENTION

This invention fulfills the need of reducing material costs of devices with carrier structures while improving productivity by using a single carrier for multiple devices. A preferred embodiment of the invention comprises a plurality of semiconductor die which are electrically coupled to the proximal ends of the leads of a leadframe. Each die and associated proximal ends are encapsulated in a package body. A single carrier structure which encircles all of the encapsulated die encapsulates portions of the distal ends of the leads of the leadframe, leaving the tips of the distal ends of the leads exposed along the periphery of the carrier structure. The carrier structure is ultimately separated from the individual package bodies by severing an intermediate portion of the leads.

DETAILED DESCRIPTION OF THE INVENTION

Figure 1:
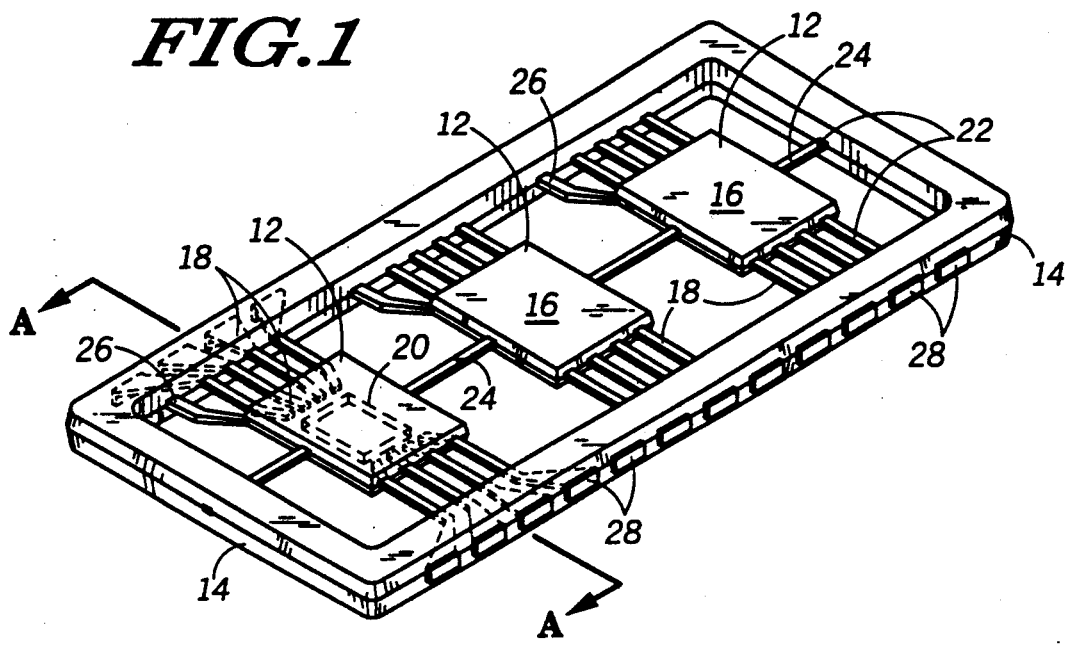
FIG. 1 is a three-quarters view of the electronic devices and associated carrier structure of the present invention, illustrating use with TSOP (thin small outline package) Type I packages.

The disclosed invention comprises a plurality of packaged semiconductor devices encircled by one carrier structure or ring. FIG. 1 illustrates a preferred embodiment of the invention in which three packaged semiconductor devices 12 are enclosed within one carrier 14. The devices 12, which may be discrete devices, integrated circuits, or the like, can be encapsulated in a variety of package types. For instance, the package bodies 16 in FIG. 1 are representative of molded plastic packages, but may be ceramic, or made from preformed plastic or metal parts. Extending from the edges of the devices 12 are leads 18. The leads 18 also extend into the packages 16 and into the carrier 14 as partially illustrated by the dashed lines. The leads 18 external to the devices 12 are used to electrically access semiconductor die 20 which are located within the packages 16. Leads 18 are part of a leadframe 22 (not shown in its entirety) which can be made from alloys such as copper or aluminum-nickel or can be made from a TAB (tape automated bonding) tape. Leadframe 22 can also include tie bars 24 which are used to join flags (not shown) to the leadframe 22. Flags are used to support the die 20 or to make backside electrical connection to the die 20, but may not be necessary depending on the type of leadframe used. (For more detail see FIG. 2).

The carrier 14 illustrated in FIG. 1 is made from the same molded material as the package bodies 16. Gates 26 leading from the carrier 14 to the package bodies 16 enable one to form the body and carrier simultaneously. However gates 26 are not a requirement of the present invention. Other methods of transferring molding material to the cavities are available, for instance using a "Dusan mold" (named after the inventor Dusan Slepcevic, U.S. Pat. No. 4,332,537) in which the transfer gates are located above or below the cavities. In such a case, gates 26 would not be a part of the final molded unit. As one skilled in the art knows, the molding compound used is expensive, therefore it may be cost effective to mold the carrier 14 prior to or following the package bodies with a less expensive material. Furthermore, the carrier need not even be molded, but may be clamped into place and made from a variety of materials, such as metals, ceramics, or premolded plastics. As a cost reduction step, the carriers may also be desiged to be reusable. Since only one carrier is used to hold numerous devices (three devices in the embodiment shown in FIG. 1) rather then an individual carrier for each device, the material costs are significantly reduced, regardless of the carrier material. Located on the periphery of the carrier 14 are contact points 28 which are the extreme distal portions of the leads 18. The contact points 28 are used to test the devices 12 while still in the carrier 14 in order to prevent damage to the leads 18, however the contact points 28 may also be used in any application which requires electrically contacting the devices 12.

The devices 12 in FIG. 1 have leads 18 extending from only two sides of the package 16. While it is possible to have leads on any number of sides, this illustration depicts use of TSOP (thin small outline package) packages. TSOP packages are generally rectangular in shape, having two opposing sides of a given length, and two remaining sides of a second length which is greater than the first length. Herein, these will be referred to as the short sides and the long sides, respectively. TSOP Type I packages have leads extending from the short sides of the package while Type II packages have leads extending from the long sides of the packages. Thus, illustrated in FIG. 1 are TSOP Type I packages 16. TSOP packages are generally used for memory devices as memory die are often designed such that contact terminals, or bonding pads, are located at two opposing sides of the die. It is, therefore, especially appropriate for this invention to be used in conjunction with memory devices, but any type of device, for example discrete, analog, digital, microprocessors, or the like, can benefit from the advantages of the present invention.

In the embodiment illustrated in FIG. 1, the number of leads 18 and the number of contact points 28 are equal. This is not a requirement of the invention and any number of leads and contact points are within the scope of the invention. For example, a standard carrier structure may be developed for five devices and have a set number of contact points, say 100. While each device may have 20 leads, it is also possible for each device to have fewer than 20 leads. The remaining contact points could act as dummy contacts, thus allowing the same carrier to be used for various pin-out configurations. Another application in which the number of contact points may differ from the number of leads is in stacking a number of carriers together, but accessing an individual device. In this application, the devices might have dummy leads, or one lead might form a number of contact points. By stacking the carriers, throughput could be improved, for instance one specially designed test socket could test several carriers at once, and space on a test board or PC board could be conserved.

Figure 2:
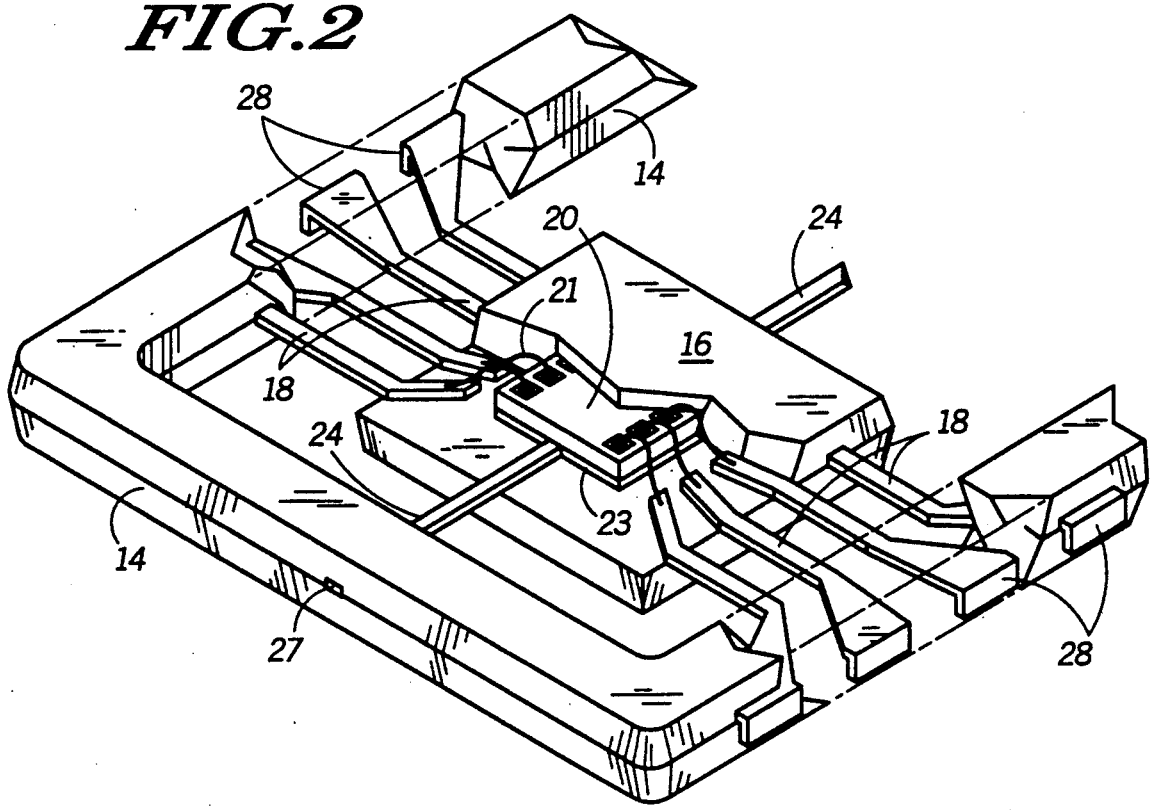
FIG. 2 is a cut-away perspective of one of the devices and a portion of the carrier structure of FIG. 1.

FIG. 2 is a cut-away perspective of a portion of the invention illustrated in FIG. 1. The package body 16 is partially removed in order to reveal what is internal to the package. The semiconductor die 20 is electrically coupled to the leads 18 by the use of wire bonds 21. Other coupling methods may be used in accordance with this invention, for example TAB. The die 20 is located in or on a die receiving area, in this case the flag 23. TAB bonding can bond the leads directly to the die, in which case a flag may not be necessary. Connected to the flag 23 are tie bars 24, which are used to keep the flag intact with the leadframe. The tie bars 24 may also extend through the carrier 14 to form another contact point 27, such as a ground to the die, if desired. Other contact points 28 which are used to access the die 20 are formed from the distal portions of the leads 18 which also extend through the carrier 14, exiting and substantially conforming to the carrier's periphery. The distance between each of the contact points 28 and between each of the leads 18 exiting the package body 16 (also known as the pitch) need not be the same, as FIG. 2 depicts. In this manner, the pitch of the contact points 28 on the carrier 14 can remain constant, even though the pitch of the leads 18 exiting the package 16 may change, thereby creating a carrier which is common to a variety of package and leadframe designs. Such a feature would allow for a single test socket design to be used for different packages, having a common carrier design.

Figure 3A:
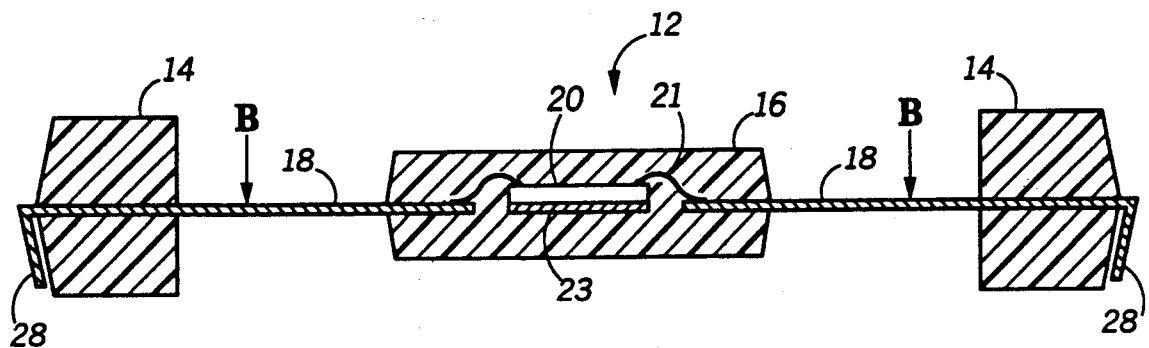
FIG. 3A is a cross-sectional view of the invention illustrated in FIG. 1 taken along the line A—A.
Figure 3B:
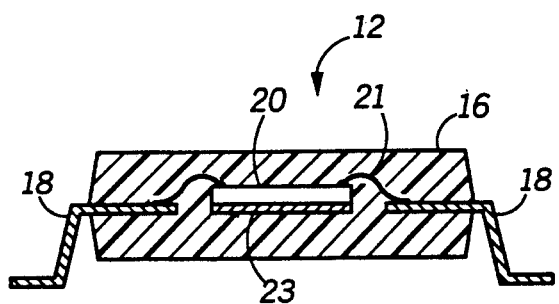
FIG. 3B illustrates the same cross-section after the carrier structure has been removed and the leads have been formed.

A cross-sectional view is illustrated in FIG. 3A which is taken along the line A—A in FIG. 1. The semiconductor device 12 is comprised of a die 20 mounted on a flag 23 and electrically coupled by wire bonds 21 to leads 18 of a leadframe (not shown). The device 12 is encapsulated by a package body 16 and is encircled by a carrier structure 14. Leads 18 exit from the package body 16 and extend into and through carrier 14 forming contact points 28. Proximal portions of the leads 18 are considered to be the portions within the package body 16. Intermediate portions of the leads 18 are the segments between the package body 16 and the carrier 14, while distal portions are those which extend through the carrier and form contact points 28. At the point of manufacture at which the carrier structure is no longer needed, be it after testing, prior to shipment, or at the customer site, the leads 18 may be severed along the intermediate portions of leads 18, for instance at or near points B. The leads can then be formed into the desired shape, such as the gull-wing configuration illustrated in FIG. 3B. Other possible lead configurations include J-lead, through-hole, or the like. It may also be suitable for the leads to be severed and even formed prior to removing the carrier structure.

Figure 4A:
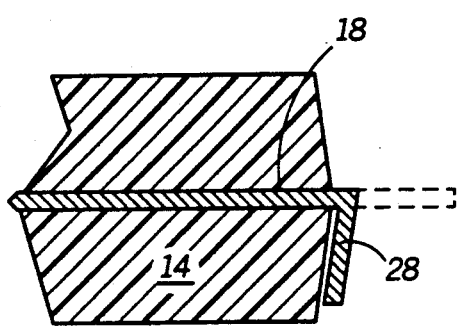
FIG. 4A illustrates in an exploded view the manner in which the contact points conform to the shape of the carrier structure.
Figure 4B:
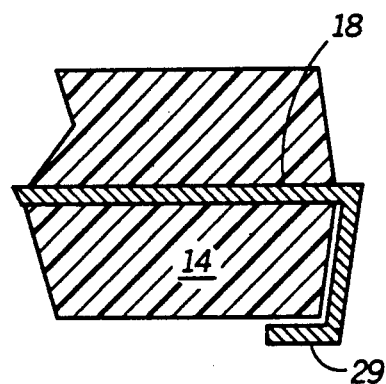
FIG. 4B illustrates an alternative form for the contact points.

The contact points along the periphery of the carrier structure can take a variety of forms, two of which are illustrated in FIG. 4A and 4B. FIG. 4A is an exploded view of the contact point 28 of FIG. 3A. As the extreme distal portion of the lead 18 exits from the carrier 14, it extends downward, conforming to the shape of the carrier 14. The lead 18 could likewise extend upward, creating a similar contact point which is also substantially vertical. It should be noted that contact points are formed when the carrier structure and the devices associated with it are excised from the leadframe as a single unit. For example, when the carrier and package bodies are molded, the leadframe is generally a planar surface. After the carrier has been formed or added around the devices, the leads would exit the carrier horizontally, as shown by the dashed line in FIG. 4A. Subsequently, the exterior portion of the leadframe is excised and the now free-standing leads are formed into the desired shape, using the carrier as a guide. An alternative contact point form is shown in the exploded view in FIG. 4B. In this embodiment, the distal portion of the lead 18 is longer than that shown in FIG. 4A in order to extend further downward and partially under the carrier 14, forming horizontal contact point 29. With this shape, contact can be made from either the bottom of the carrier or from its side.

Figure 5:
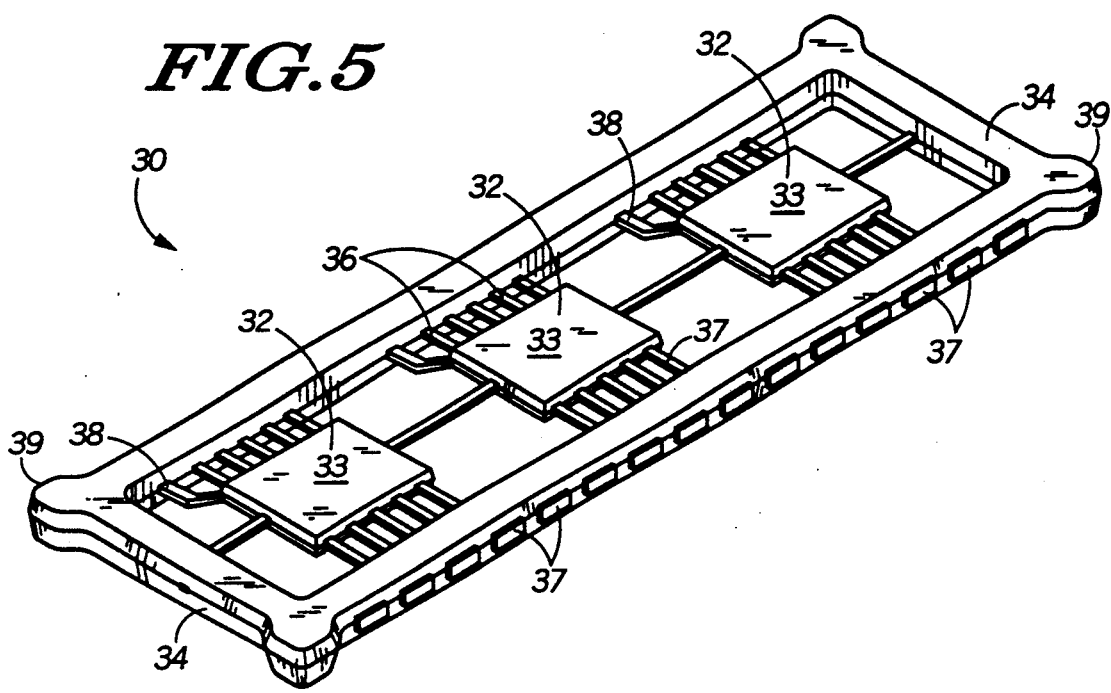
FIG. 5 is a three-quarters view of the invention which illustrates use with TSOP Type II packages and includes bumpers on the corners of the carrier structure.

FIG. 5 illustrates an embodiment 30 similar to that in FIG. 1. Semiconductor devices 32 are held in and encircled by a carrier structure 34. Leads 36 exit from the edges of the package bodies 33 and extend through the carrier 34, forming contact points 37. As in FIG. 1, gates 38 allow the carrier 34 and package bodies 33 to be formed simultaneously with a plastic molding compound, although the two can be formed individually or from materials other than plastic. In FIG. 5, leads 36 exit from the longer edges of the package bodies 33, thereby forming TSOP Type II packages. While TSOP packages have been mentioned and illustrated specifically, other package types, such as SOJ (small outline J-lead), SOIC (small outline IC), QFP (quad flat pack), and the like, may find use in accordance with the invention as well. Also shown in this embodiment are bumpers 39 at the corners of the carrier 34 which are included to reduce damage to contact points 37. the carrier 34 impacts against another object, the bumpers 39 will contact the object first. Depending on the shape and relative position of the other object, the contact points 37 may remain unharmed.

Figure 6:
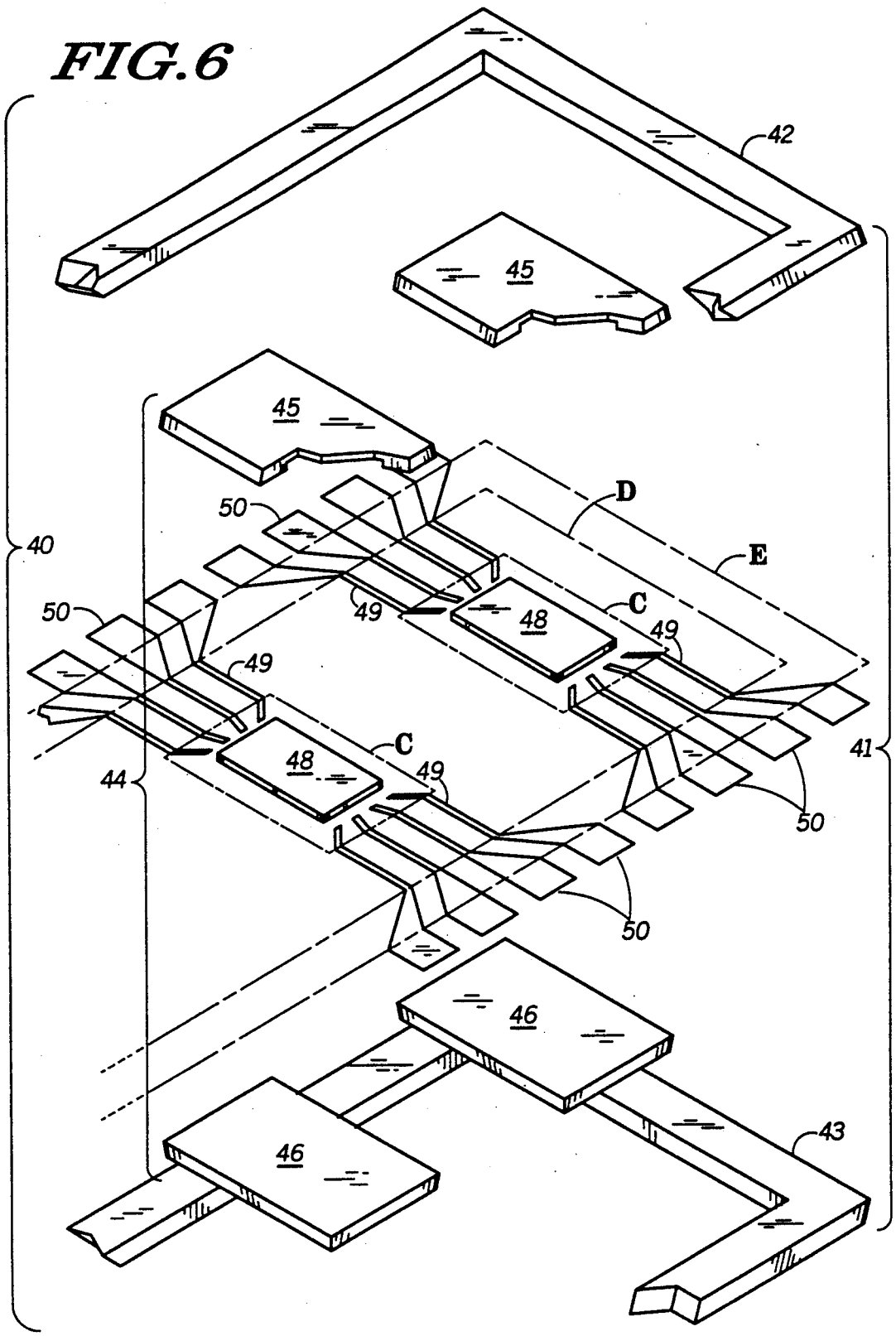
FIG. 6 is a three-quarters, segmented view of another embodiment of the invention in which the carrier structure and the package body are each comprised of two parts.

FIG. 6 illustrates another embodiment of the present invention which uses a preformed carrier and package bodies. The carrier structure 41 (only partially shown) is comprised of an upper portion 42 and a lower portion 43. The package bodies 44 are also comprised of an upper portion 45 and a lower portion 46. Such portions may be held together with an adhesive material, such as epoxy, or perhaps by a clamping mechanism. Within package bodies 44 are the semiconductor die 48, and proximal portions of leads 49. (Line C has been added to show what elements are within package bodies 44). Distal portions of the leads 49 are sandwiched between the upper and lower portions of the carrier, 42 and 43 respectively. Lines D and E represent the outline of carrier 41 when the unit 40 is assembled. Extreme distal portions of the leads 49 extend beyond the outline of carrier 41 (i.e. beyond line E) and are used to form contact points 50 (not shown in final form, refer to FIG. 4). One advantage to this invention which is clear from this illustration is that the pitch of the leads exiting the package can be much smaller than the pitch of the contact points on the periphery of the carrier.

While the embodiment of FIG. 6 has both the carrier 41 and the package bodies 44 having upper and lower portions, it is also in accordance with this invention that either the carrier 41 or package bodies 44 may have such portions. For example carrier 41 may be preformed and package bodies 44 may be molded. Carrier 41 can be made from a variety of materials, such as ceramic, preformed plastic, anodized aluminum, other metals, or the like, as can the package bodies 44. One particular application may use a ceramic cavity package, but with a molded carrier structure in order to reduce costs.

Figure 7:
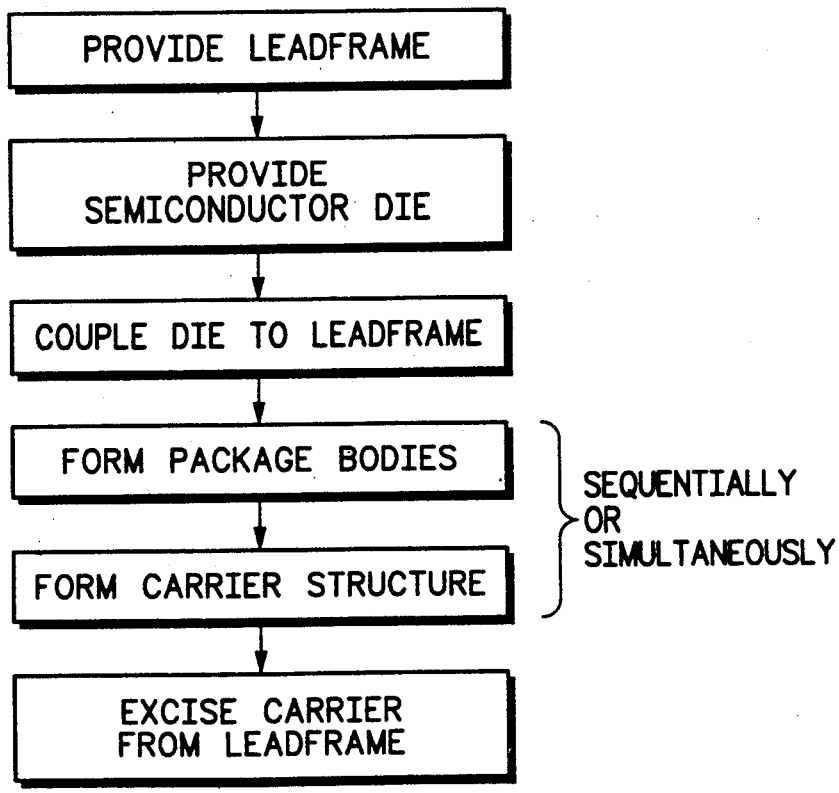
FIG. 7 is a flow chart of the process flow in accordance with the invention.

Fabrication of the invention is similar to that of existing packages, as shown in the process flow of FIG. 7. A leadframe is provided, being made of a copper alloy, aluminum-nickel alloy, TAB tape, or the like. Semiconductor die, such as memory, logic, or discrete devices, are also provided and electrically coupled to the leadframe by any available coupling method. For the case in which the carrier structure and package bodies are made of a molded plastic, the leadframe with die coupled thereto are positioned in a mold tool. The mold platens are brought together to form cavities around each die and a single cavity around the distal portions of the leads. A molding compound is injected into the cavities, forming package bodies around each of the semiconductor die and a carrier structure which encircles all of the package bodies. The carrier structure encapsulates distal portions of the leads, but leaves the extreme distal portions of the leads exposed as contact points. Forming the package bodies and the carrier structure may be done simultaneously, or sequentially in any order. The carrier structure is excised from the leadframe, creating a single unit having a plurality of semiconductor devices. The advantages associated with the single unit are increased productivity due to fewer handling sequences and material cost savings in the leadframe and carrier structure materials. Costs associated with testing operations can also be reduced with specially designed test sockets.

Thus it is apparent that there has been provided, in accordance with the invention, a structure and process for fabrication of semiconductor devices that fully meet the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, leads can exit from any number of sides of the package, not just from two as illustrated. In addition, more than one semiconductor die may be contained within an individual package body. The package bodies and carrier structure can be made from materials other than molded plastics. TAB technology can be used in conjunction with or in replacement of traditional wire bonding. And package types other than TSOP can be used, such as SOJ, SOIC, QFP, and the like. Therefore, it is intended that this invention encompass all such variations and modifications as fall within the scope of the appended claims.

What is claimed is:

1. Packaged semiconductor devices within one carrier structure, comprising:

a leadframe having a plurality of semiconductor die receiving areas, each having a plurality of leads on at least two sides of said receiving areas and extending therefrom, each lead having a proximal end near said receiving area and a distal end away from said receiving area, said receiving areas collectively occupying a bounded spatial area;

a semiconductor die located in each of said plurality of receiving areas and electrically coupled to said proximal ends of said plurality of leads;

package bodies encapsulating each of said semiconductor die and said coupled, proximal ends of said plurality of leads; and a single carrier structure spaced apart from and encircling said bounded spatial area and all of said semiconductor die, and encapsulating portions of said distal ends of said plurality of leads, leaving the tips of said distal ends of said plurality of leads exposed along a perimeter of said carrier structure for electrical access to each of said semiconductor die in each of said receiving areas.

2. The packaged semiconductor devices of claim 1 wherein each of said package bodies have two sides of a given length and two sides with a length which is greater then said given length.

3. The packaged semiconductor devices of claim 2 wherein said leads extend away from said sides of a given length.

4. The packaged semiconductor devices of claim 2 wherein said leads extend away from said sides with a length which is greater then said given length.

5. The packaged semiconductor devices of claim 1 wherein said semiconductor die are memory devices.

6. Packaged semiconductor devices within a carrier structure comprising:

a leadframe having a plurality of semiconductor die receiving areas, each having a plurality of leads on at least two sides of said receiving areas and extending therefrom, each lead having a proximal end near one of said receiving areas and a distal end away from said one receiving area, said receiving areas collectively occupying a bounded spatial area;

a semiconductor die located in each of said plurality of receiving areas and electrically coupled to said proximal ends of said plurality of leads;

molded package bodies encapsulating each of said semiconductor die and said coupled, proximal ends of said plurality of leads;

a single molded carrier structure having an outer periphery, spaced apart from and encircling said bounded spatial area and all of said semiconductor die and encapsulating portions of said distal ends of said plurality of leads, leaving the tips of said distal ends of said plurality of leads exposed along said periphery of said carrier structure for electrical access to each of said semiconductor die in each of said receiving areas;

exposed contact points located along said outer periphery of said molded carrier structure formed from said exposed distal ends and substantially conforming to said carrier structure; and exposed intermediate portions of said plurality of leads located between said proximal and distal ends.

7. The packaged semiconductor devices of claim 6 wherein said semiconductor die are memory devices.

8. The packaged semiconductor devices of claim 6 wherein said leadframe further comprises tie bars which extend between said plurality of semiconductor die receiving areas.

9. Packaged semiconductor devices with a carrier ring structure comprising:

a plurality of semiconductor devices encapsulated in protective package bodies and having leads extending outwardly from said protective bodies; and a single carrier ring structure having two sides and two ends and surrounding all of said plurality of semiconductor devices and encapsulating distal portions of said leads of all of said semiconductor devices to form electrical contact to each of said semiconductor devices via contacts along said two sides of said single carrier ring structure.

10. The packaged semiconductor devices of claim 9 wherein said protective package bodies are made from a plastic molding compound.

11. The packaged semiconductor devices of claim 9 wherein said carrier ring structure is made from a plastic molding compound.

12. The packaged semiconductor devices of claim 9 wherein said protective package bodies and said carrier ring structure are made of the same material.

13. The packaged semiconductor devices of claim 9 wherein said protective package bodies and said carrier ring structure are made of different materials.

* * * * *